United States Patent
Chen et al.

(10) Patent No.: US 10,642,319 B2
(45) Date of Patent: May 5, 2020

(54) FLEXIBLE STACKED UP CHASSIS

(71) Applicant: QUANTA COMPUTER INC., Taoyuan (TW)

(72) Inventors: Chao-Jung Chen, Taoyuan (TW); Chih-Wei Lin, Taoyuan (TW); Ming-Lun Ku, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/972,804

(22) Filed: May 7, 2018

(65) Prior Publication Data
US 2019/0215981 A1     Jul. 11, 2019

Related U.S. Application Data

(60) Provisional application No. 62/613,865, filed on Jan. 5, 2018.

(51) Int. Cl.
*G06F 1/18* (2006.01)
*H05K 7/14* (2006.01)
(Continued)

(52) U.S. Cl.
CPC .............. *G06F 1/181* (2013.01); *G06F 1/187* (2013.01); *G11B 33/124* (2013.01);
(Continued)

(58) Field of Classification Search
CPC ........ G06F 1/1658; G06F 1/187; G06F 1/181; G11B 33/124; G11B 33/125; H05K 7/1492
See application file for complete search history.

(56) References Cited

U.S. PATENT DOCUMENTS 5,602,721 A * 2/1997 Slade ........................ G06F 1/18
                                                  206/504
5,737,189 A * 4/1998 Kammersgard .......... G06F 1/18
                                                  312/107.5
(Continued)

FOREIGN PATENT DOCUMENTS

DE        202010013994 U1      12/2010
JP           2003069252 A        3/2003

OTHER PUBLICATIONS

Extended European Search Report for EP Application No. 18205025.2, dated Jun. 4, 2019.
(Continued)

*Primary Examiner* — Nidhi Thaker
(74) *Attorney, Agent, or Firm* — Nixon Peabody LLP; Zhou Lu

(57) ABSTRACT

An adaptable chassis having an upper box chassis structure including a power supply. The upper box structure includes side walls to receive at least one component sled and registration features. A lower box structure includes side walls to receive at least one component sled. The lower box structure includes a registration feature to engage the registration feature of the first chassis structure. The lower box structure includes a power connector to obtain power from the power supply. The lower box structure may be replaced with large capacity structures when additional component sleds need to be added since the power supply resides in the upper box structure.

7 Claims, 6 Drawing Sheets

(51) Int. Cl.
*G11B 33/12* (2006.01)
*G06F 1/16* (2006.01)

(52) U.S. Cl.
CPC ......... *G11B 33/125* (2013.01); *H05K 7/1491* (2013.01); *H05K 7/1492* (2013.01); *G06F 1/1658* (2013.01)

(56) References Cited

U.S. PATENT DOCUMENTS

| | | | | |
|---|---|---|---|---|
| 5,864,467 | A * | 1/1999 | Recchia | H05K 5/0021 174/561 |
| 5,940,274 | A * | 8/1999 | Sato | H05K 7/1488 312/223.2 |
| 6,141,221 | A * | 10/2000 | Tong | H05K 5/0021 312/223.1 |
| 6,731,851 | B2 | 5/2004 | Sato et al. | |
| 7,499,282 | B1 * | 3/2009 | Loucks | G06F 1/1626 361/730 |
| 9,491,895 | B2 | 11/2016 | Steeves et al. | |
| 9,693,464 | B2 | 6/2017 | Bailey et al. | |
| 10,120,422 | B2 * | 11/2018 | Godfrey | G06F 1/182 |
| 2006/0285289 | A1 * | 12/2006 | Jones | G06F 1/181 361/679.31 |
| 2012/0203393 | A1 | 8/2012 | Dumitru et al. | |
| 2015/0091420 | A1 * | 4/2015 | Liu | G06F 1/1601 312/223.2 |
| 2015/0181750 | A1 * | 6/2015 | Bailey | H05K 7/20736 361/679.48 |
| 2015/0189787 | A1 * | 7/2015 | Bailey | H05K 7/1489 361/679.48 |
| 2015/0359131 | A1 * | 12/2015 | Moore | H05K 7/1488 211/26 |

OTHER PUBLICATIONS

JP Office Action for Application No. 2018-221501, dated Jan. 14, 2020, w/ First Office Action Summary.

* cited by examiner

FLEXIBLE STACKED UP CHASSIS

PRIORITY CLAIM

This application claims priority under 35 U.S.C. § 119 to U.S. Provisional Application No. 62/613,865, filed on Jan. 5, 2018. The contents of that application are hereby incorporated by reference in their entirety.

TECHNICAL FIELD

The present disclosure relates generally to a modular chassis. More particularly, aspects of this disclosure relate to a chassis structure that has one box with internal support components, and a second box that may have different sizes to accommodate different component sleds.

BACKGROUND

The emergence of the cloud for computing applications has increased the demand for off-site installations, known as data centers, that store data and run applications accessed by remotely connected computer device users. Such data centers typically have massive numbers of devices such as servers, switches and storage devices to store and manage data and so they may be accessed in a convenient manner by remote computer users. A typical data center has physical rack or chassis structures with attendant power and communication connections. Such racks may hold multiple network devices, that may be swapped in and out of the rack.

A typical rack includes a chassis that has side walls joined by a bottom wall and a top wall. The rack may also include various electronic support components that may be used to support devices that are installed in the rack. For example, a rack system may include a power distribution board that includes power supply units to supply power to the devices in the rack. A bus bar may be provided to provide support for cables to direct power from the power supply units to the devices in the rack. Each of the side walls has multiple registration features such as a groove or a tab that are periodically spaced apart. Multiple shelves are installed between the side walls on the registration features. Once installed, each shelf may hold different network devices. Different network devices such as servers, switches, routers, and the like are carried in removable sled structures that may be inserted on one of the shelves in the rack. The size of typical sled components is based in standard height units. For example, height may be expressed in terms of "U". Thus a standard 1U rack-mount server is 1.75 inches high, and a 2U server measures three inches in height. Typical network devices may be designed with different standard units of height.

Current racks are limited by the height of the side walls. This arrangement works well when the network components in the rack are the same devices or are different devices having identical sizes. However, such an arrangement inherently restricts the inner space to efficiently hold varying numbers of sleds. Additional component sleds cannot be added to a rack that has already been filled with component sleds. Further, since network components and their corresponding sleds often have different sizes (e.g., different widths and heights), different chassis designs must be used for different components. In order to accommodate different height devices or additional devices in one chassis, the chassis must be replaced, thereby increasing expense and sacrificing operational efficiency. These situations are problematic, as network equipment is continually updated, and data center administrators may seek to add new equipment. Further, new network equipment may have different sizes, thus requiring data center administrators to change racks to accommodate desired new equipment.

Thus, there is a need for an adaptable chassis that can be easily adjusted to accommodate different sleds having different heights. There is also a need for a chassis that allows for the fixed placement of power supply units and bus bars, but also accommodates different sized devices. There is a further need for an adaptable chassis that allows for modular adjustment to accommodate additional devices.

SUMMARY

One disclosed example is an adaptable chassis having a first chassis structure including a power supply; side walls to receive at least one component sled; and a registration feature. The adaptable chassis also has a second chassis structure including side walls to receive at least one component sled; a registration feature to engage the registration feature of the first chassis structure; and a power connector to obtain power from the power supply. The first chassis structure and the second chassis structure are slidably engaged with each other.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which.

Figure 1A:
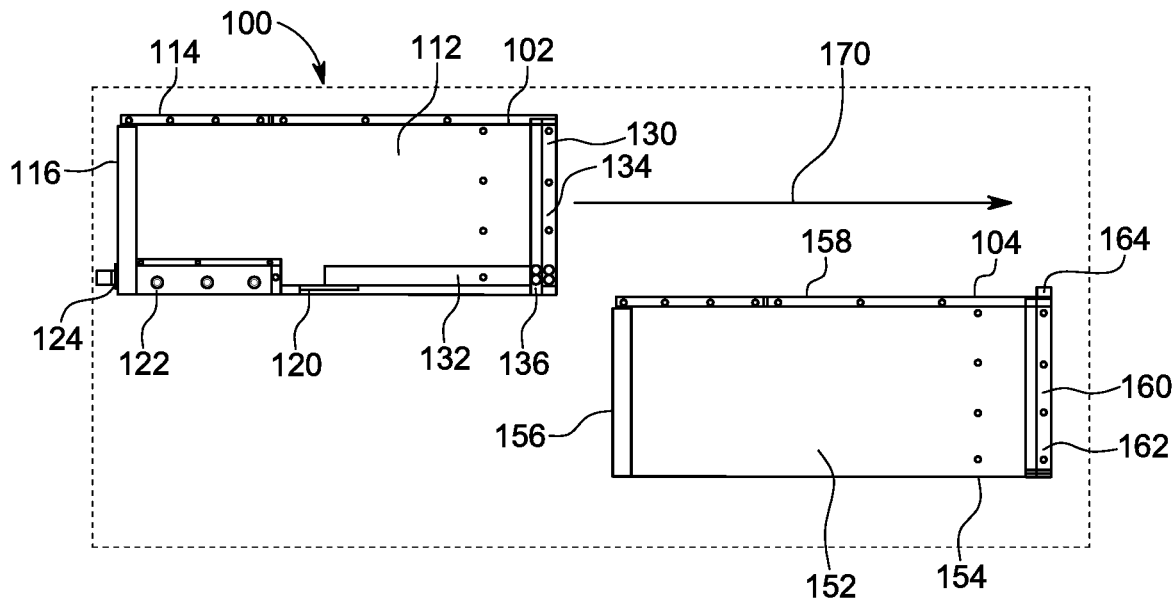
FIG. 1A is an exploded side view of a two box chassis structure.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Figure 1B:
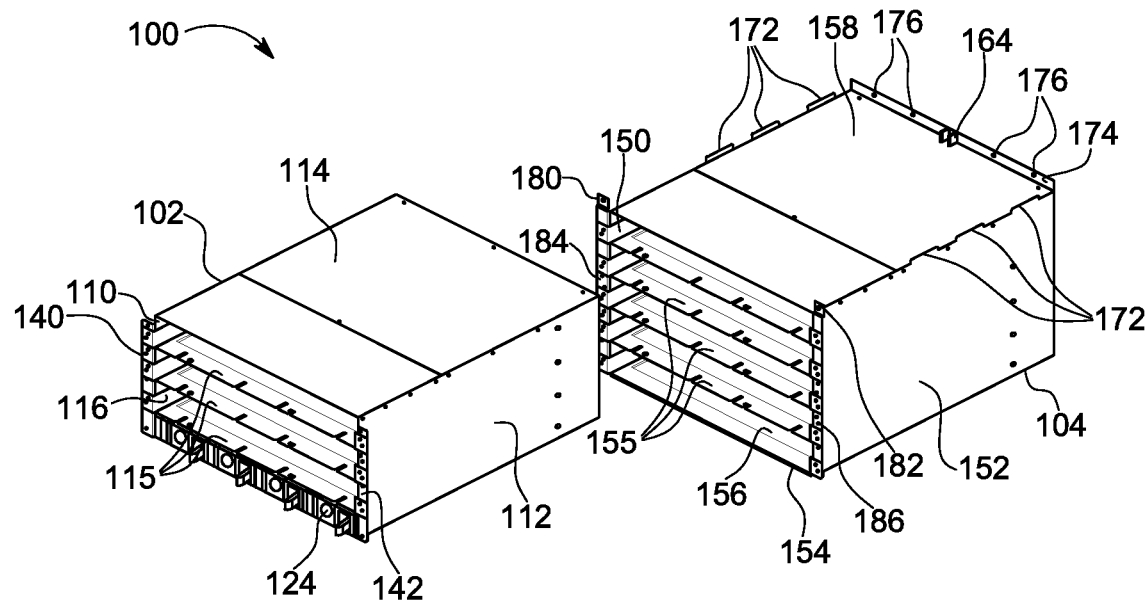
FIG. 1B is an exploded perspective view of the two box chassis structure in FIG. 1A.

FIGS. 1A and 1B show a two component chassis structure 100 that allows the flexibility to change the installation of components, while maintaining a fixed structure of support components. The two component chassis structure 100 includes an upper box structure 102 and a lower box structure 104. As will be explained below, both box structures 102 and 104 may hold electronic component sleds that may be swapped in and out of the structures. The upper box structure 102 has side walls 110 and 112 that have top edges. The top edges of the side walls 110 and 112 are joined by a top wall 114. The side walls 110 and 112 include registration features such as slots separated by shelves 115 that may be employed to support component sleds. Each of the component sleds may hold network devices such as servers, switches, routers, memory devices, and the like. The upper box structure 102 includes an open front end 116 that allows component sleds to be inserted or removed. The bottom edges of the side walls 110 and 112 include engagement features that mate with the lower box structure 104, as will be explained below.

The bottom edges of the side walls 110 and 112 also include cross members that support a power distribution board 120. The power distribution board 120 includes electronic components to support different component sleds that may be installed in the chassis structure 100. The power distribution board 120 in this example mounts a power supply unit 122 in a power supply cage 124. It is to be understood that multiple power supply units such as the power supply unit 122 may be provided on the power distribution board 120. In this example, the power distribution board 120 includes four power supply units such as power supply unit 122. Electronic components such as a chassis management controller and interface circuits, may be installed on the power distribution board 120 as well. Further, mechanical components such as fans and heat sinks may also be provided for the power supply units on the power distribution board 120.

A bus bar structure 130 is provided in the interior of the upper box structure 102. The bus bar structure 130 supports cables (not shown) that connect power from the power supply unit 122 to electronic component sleds inserted in the upper box structure 102. In this example, the bus bar structure 130 includes a horizontal support member 132. One end of the horizontal support member 132 is connected to a vertical bus bar 134. The vertical bus bar 134 extends approximately the height of the side walls 110 and 112, and is proximate to the rear end of the upper box structure 102. The vertical bus bar 134 provides support for power cables to supply power to electronic component sleds that are installed in the upper box structure 102. The opposite end of the horizontal support member 132 is anchored on the power distribution board 120. The junction of the horizontal support member 132 and the vertical bus bar 134 includes a connection point 136.

The side walls 110 and 112 also include respective flanges 140 and 142 that extend from the open end 116 of the upper box structure 102. The flanges 140 and 142 include different registration features that allows sleds inserted in the upper box structure 102 to be further secured.

As seen in FIGS. 1A-1B, the lower box structure 104 includes a pair of side walls 150 and 152. The bottom of the side walls 150 and 152 are joined by a bottom wall 154. The side walls 150 and 152 include registration features such as slots defined by shelves 155 that may be employed to support electronic component sleds. The side walls 150 and 152 form an open front end 156. A top wall 158 joins the tops of the side walls 150 and 152. The additional electronic component sleds may be inserted through the open front end 156. The top of the side walls 150 and 152 include engagement features—that may engage the engagement features of the side walls 110 and 112—to join the lower box structure 104 with the upper box structure 102.

A vertical bus bar 160 is supported by the bottom wall 154 near the rear end of the lower box structure 104. The vertical bus bar 160 provides support for power cables that provide power to the component sleds installed in the lower box structure 104. The vertical bus bar 160 has a first end 162 that is attached to the bottom wall 154 at the rear end of the lower box structure 104. An opposite end has a connection point 164 that engages the connection point 136 of the upper box structure 102, when the upper box structure 102 and the lower box structure 104 are mated together.

The upper box structure 102 and the lower box structure 104 may be slidably engaged with each other to form a single structure. As seen by an arrow 170 in FIG. 1A, the upper box structure 102 may be mated to the front end 156 of the lower box structure 104. The upper box structure 102 can be moved toward the right of FIG. 1A until the bus bar structure 130 is aligned with the vertical bus bar 160. The top edge of the side walls 150 and 152 include protruding tabs 172 that provide a guide from the upper box structure 102 to rest on the top wall 158 of the lower box structure 104. The lower box structure 104 also includes a back stop member 174 extending from the rear end of the top wall 158. The back stop member 174 prevents the upper box structure 102 from sliding off the end of the top wall 158. The back stop member 174 includes protruding guide pins 176 that may be mated with holes in the upper box structure 102 to lock the upper box structure 102 to the back stop member 174. Two tab members 180 and 182 extend from respective flanges 184 and 186 at the front of the side walls 150 and 152 at the front end of the lower box structure 104. The two tab members 180 and 182 may be secured to the flanges 140 and 142 of the upper box structure 102. The bus bar structure 130 is then connected with the vertical bus bar 160 by engaging the connection point 136 with the connection structure 164. In this manner, a bus bar structure consisting of the bus bar structure 130 and the vertical bus bar 160 extends over the height of the joined upper and lower box structures 102 and 104.

Figure 2A:
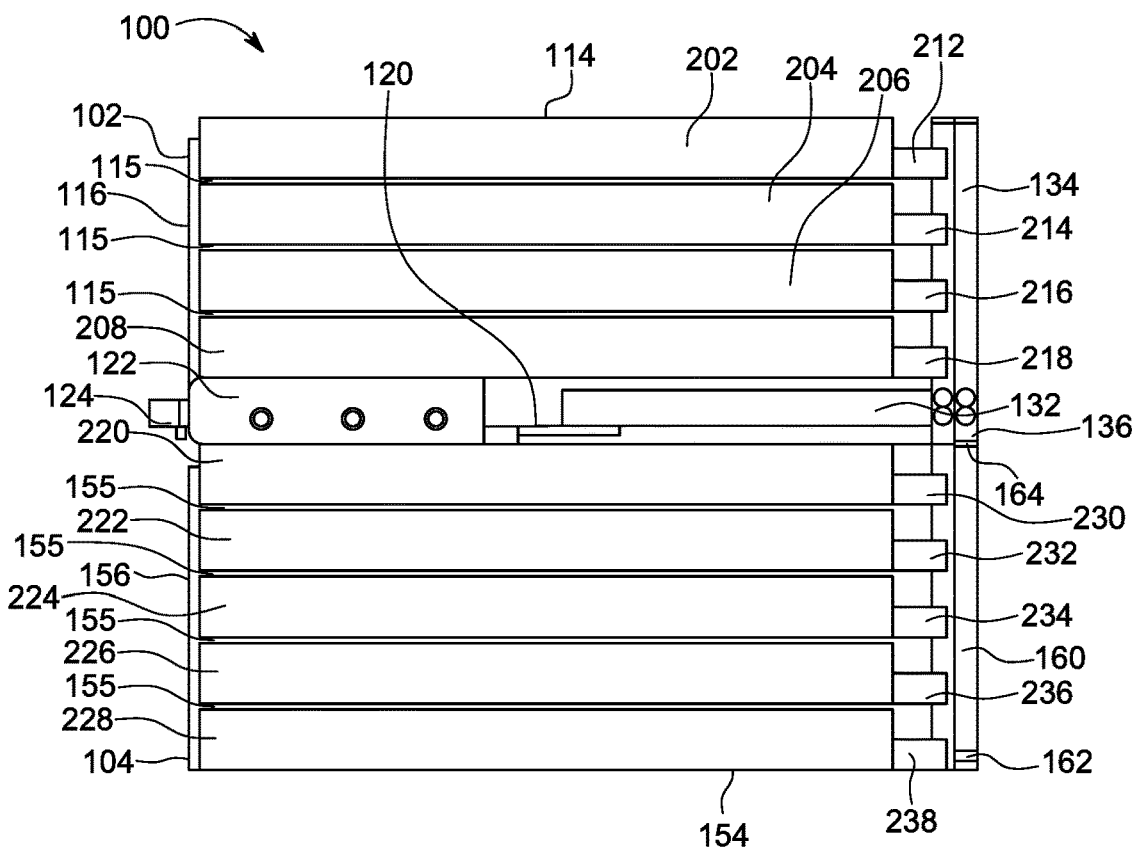
FIG. 2A is a side view of the assembled two box chassis structure in FIGS. 1A-1B.
Figure 2B:
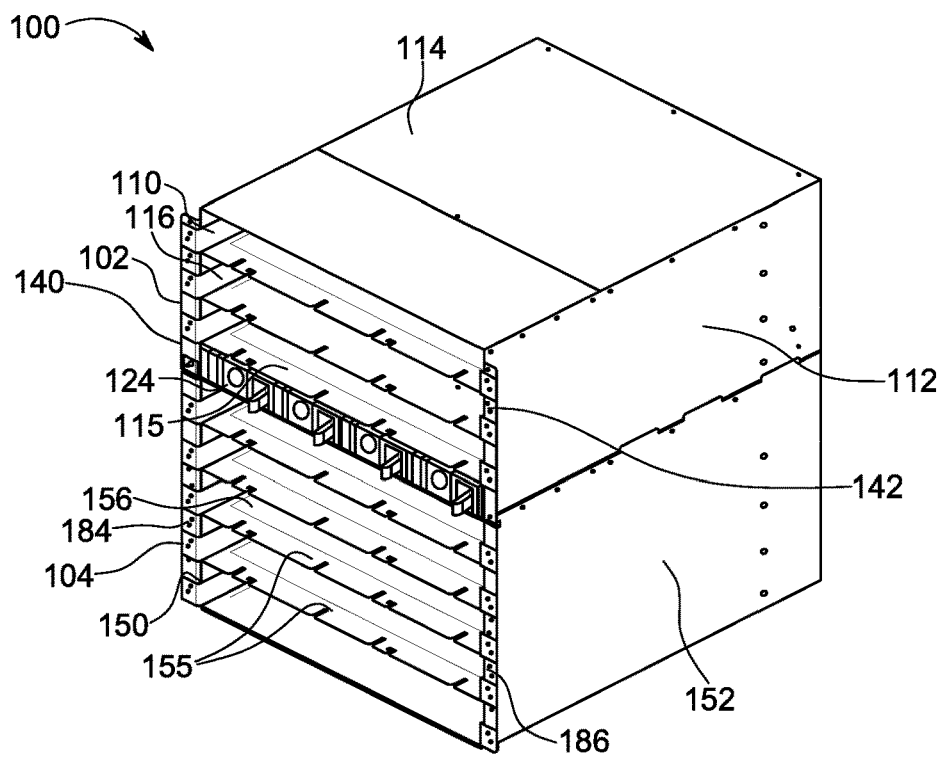
FIG. 2B is a front perspective view of the assembled two box chassis structure in FIG. 1A.
Figure 2C:
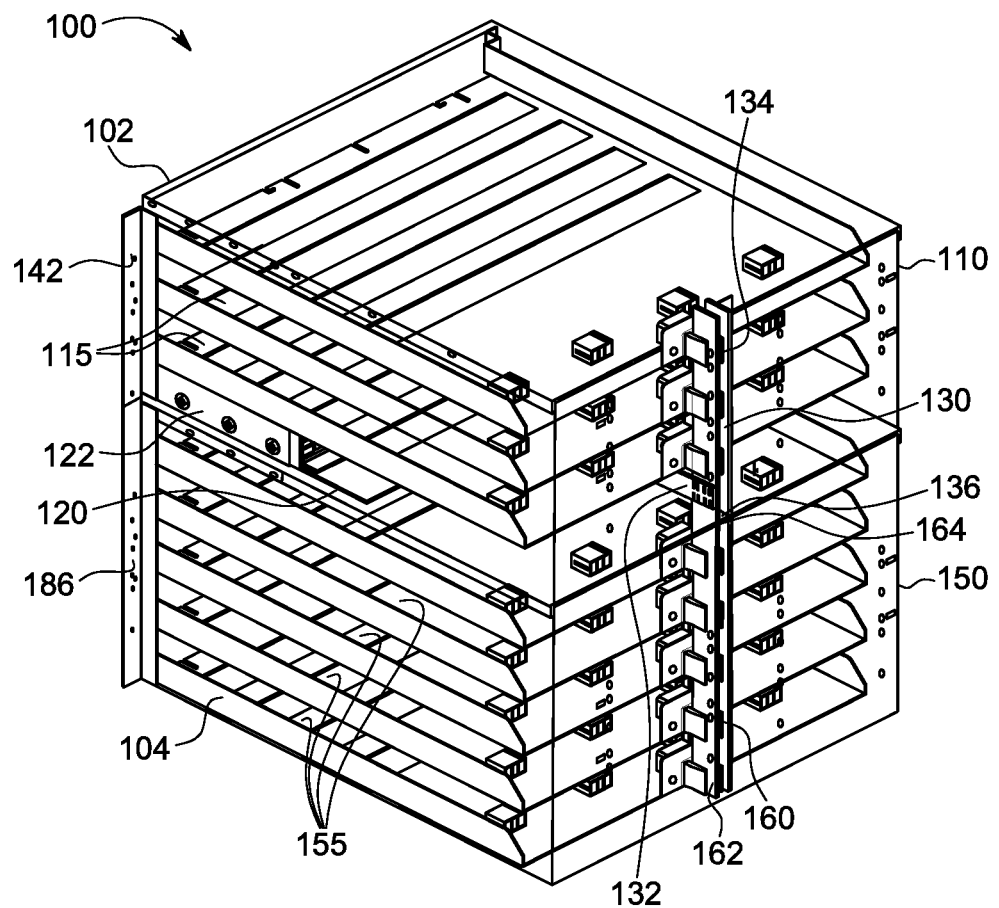
FIG. 2C is a rear perspective view of the assembled two box chassis structure in FIGS. 1A-1B.

The assembled chassis 100 may be seen in FIG. 2A, which is a cross section view of the assembled upper box structure 102 and lower box structure 104; FIG. 2B, which is a front perspective view of the assembled upper box structure 102 and lower box structure 104; and FIG. 2C, which is a rear perspective cutaway view of the assembled upper box structure 102 and lower box structure 104. Like elements in FIGS. 2A-2C are labeled with identical numbers as their counterparts in FIGS. 1A-1B. As seen in FIG. 2A, four component sleds 202, 204, 206, and 208 are installed in the shelves 115 of the upper box structure 102. The component sleds 202, 204, 206, and 208 include respective connectors 212, 214, 216, and 218 that are attached to the vertical bus bar 134. The connectors 212, 214, 216, and 218 draw power that is distributed by the vertical bus bar 134 from the power supply units on the power distribution board 120. Thus, the component sleds 202, 204, 206, and 208 in the upper box structure 102 are powered by the power supply units on the power distribution board 120. The component sleds 202, 204, 206, and 208 may be inserted between the side walls 110 and 112 in FIG. 1A and connected via their respective connectors 212, 214, 216, and 218.

Similarly, electronic component sleds may be inserted through the front end 156 of the lower box structure 104 and mounted on shelves 155. In this example, five component sleds 220, 222, 224, 226, and 228 are installed in the lower box structure 104 as shown in FIG. 2A. The component sleds 220, 222, 224, 226, and 228 include respective connectors 230, 232, 234, 236, and 238 that are attached to the vertical bus 160. The connectors 230, 232, 234, 236, and 238 draw power from the power supply units on the power distribution board 120. Power is distributed by the vertical bus bar 134 to the vertical bus 160. Thus, the component sleds 220, 222, 224, 226, and 228 in the upper box structure 102 are powered by the power supply units on the power distribution board 120.

Figure 3A:
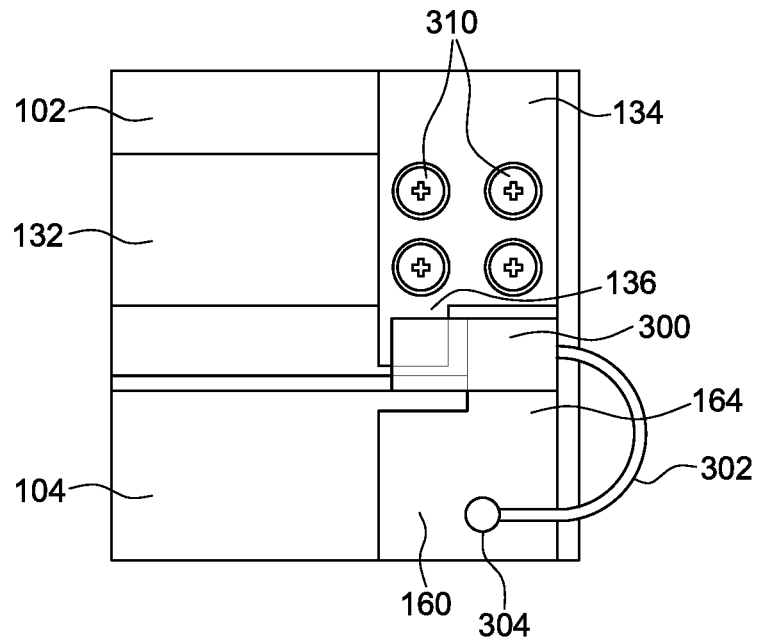
FIG. 3A is a close up side view of the rear attachment of the two boxes of the chassis structure in FIGS. 1A-1B.
Figure 3B:
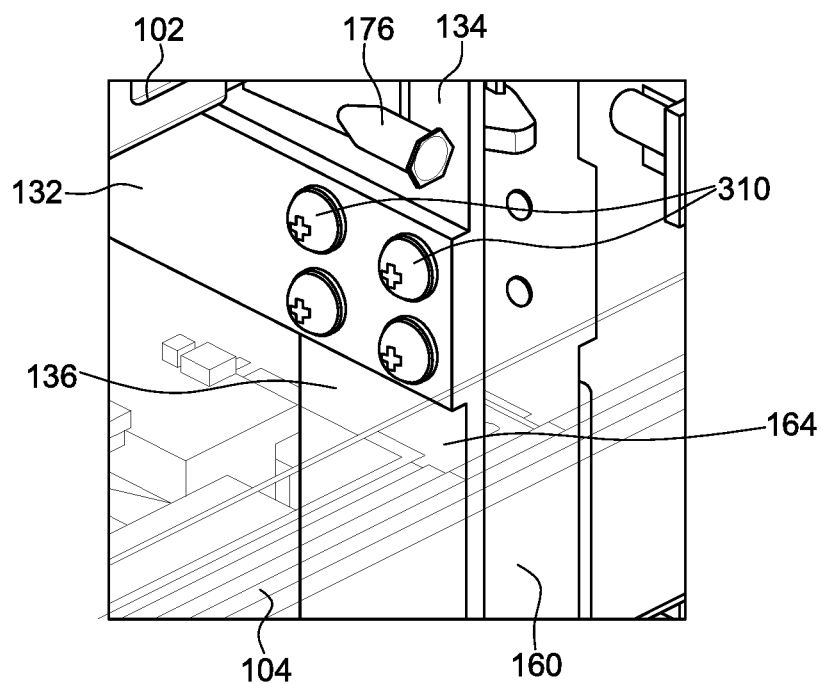
FIG. 3B is a close up perspective of the rear attachment of the two boxes of the chassis structure in FIG. 3A.

FIG. 3A is a close up side view and FIG. 3B is a perspective view of the connection of the vertical bus structure 130 (attached to the upper box structure 102 as shown in FIG. 1A) to the vertical bus 160 (attached to the lower box structure 104 as shown in FIG. 1A). Like elements in FIGS. 3A-3B are labeled with identical numbers as their counterparts in FIGS. 1A-1B and 2A-2B. As may be seen in FIG. 3A, a clip 300 joins the connection point 136 and the connection point 164. The clip 300 includes an internal electrical connection that draws power from the vertical bus structure 130. The power is routed by the clip 300 to a cable 302 that sends power to a plug 304 on the vertical bus 160. Thus, the vertical bus 160 may be used to power the component sleds on the lower box 104 such as the component sled 220 through a connector such as the connector 230 (as shown in FIG. 2A).

As may be seen in FIGS. 3A-3B, the vertical bus structure 130 (in FIGS. 1A-1C) may have separate structural components. In this example, the horizontal support member 132 is a separate piece from the vertical bus bar 134. Thus, a series of screws 310 join the horizontal support member 132 to the vertical bus bar 134.

Figure 4A:
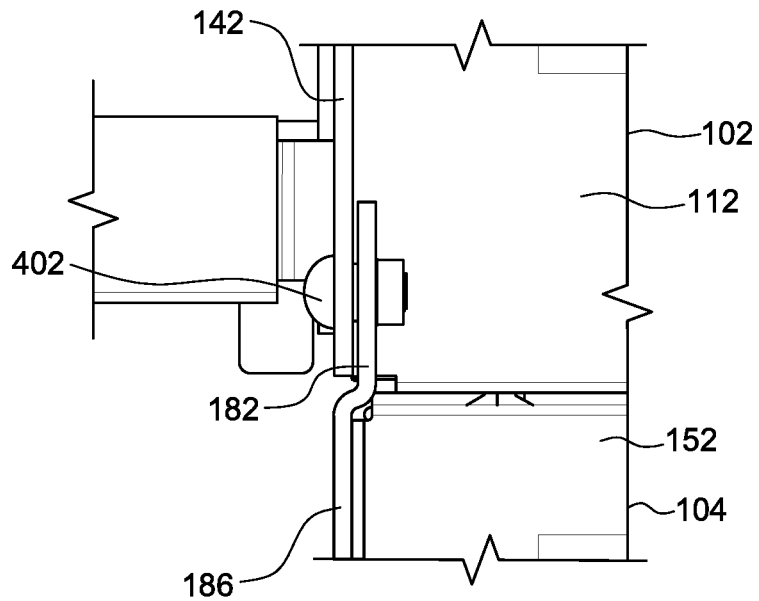
FIG. 4A is a close up side view of the front attachment of the two boxes of the chassis structure in FIGS. 1A-1B.
Figure 4B:
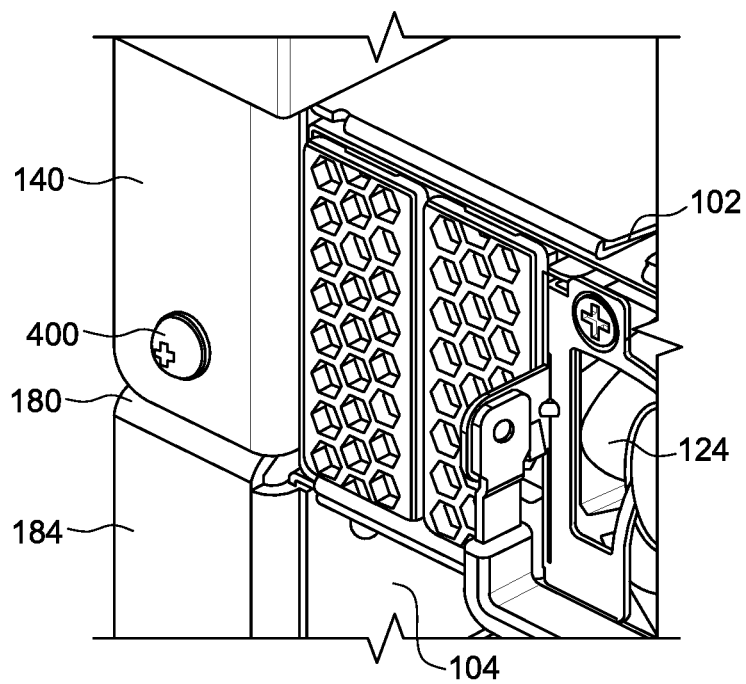
FIG. 4B is a close up perspective view of the front attachment of the two boxes of the chassis structure in FIGS. 1A-1B.

FIG. 4A is a close up side view and FIG. 4B is a perspective view of the front attachment of the upper box structure 102 to the lower box structure 104 as shown in FIGS. 2A-2C). Like elements in FIGS. 4A-4B are labeled with identical numbers as their counterparts in FIGS. 1A-1B and 2A-2C. When the upper box structure 102 is mated with the lower box structure 104, the lower ends of the flanges 140 and 142 overlap the tabs 180 and 182 of the flanges 184 and 186 as shown in FIGS. 4A-4B. Each of the flanges 140 and 142 have a hole that aligns with a similar hole on the tabs 180 and 182. When the upper box structure 102 is positioned properly on the lower box structure 104, a screw 400 may be inserted to join the flange 140 to the tab 180 as shown in FIG. 4B. Similarly, on the other side, a screw 402 may be inserted to join the flange 142 to the tab 182 as shown in FIG. 4A. Thus, the upper and lower box structures 102 and 104 are fixed in the front via the screws 400 and 402 as well as through insertion of the upper box structure 102 on the guide pins 176 shown in FIG. 1B.

Returning to FIGS. 2A-2C, the electronic component sleds in the upper box 102 may constitute a network system, while the electronic component sleds in the lower box 104 may constitute a separate network system. Each such system must have a power supply to deliver power to the electronic components held by the electronic component sleds. As explained above, the power supply units are installed in the power distribution board 120 of the upper box structure 102. Thus, the height of the lower box structure 104 may be customized to provide more space to accommodate different sized electronic components since it does not have to be designed in relation to a power supply or other support components. The size of the lower box structure 104 may also be selected to add additional electronic components.

Figure 5:
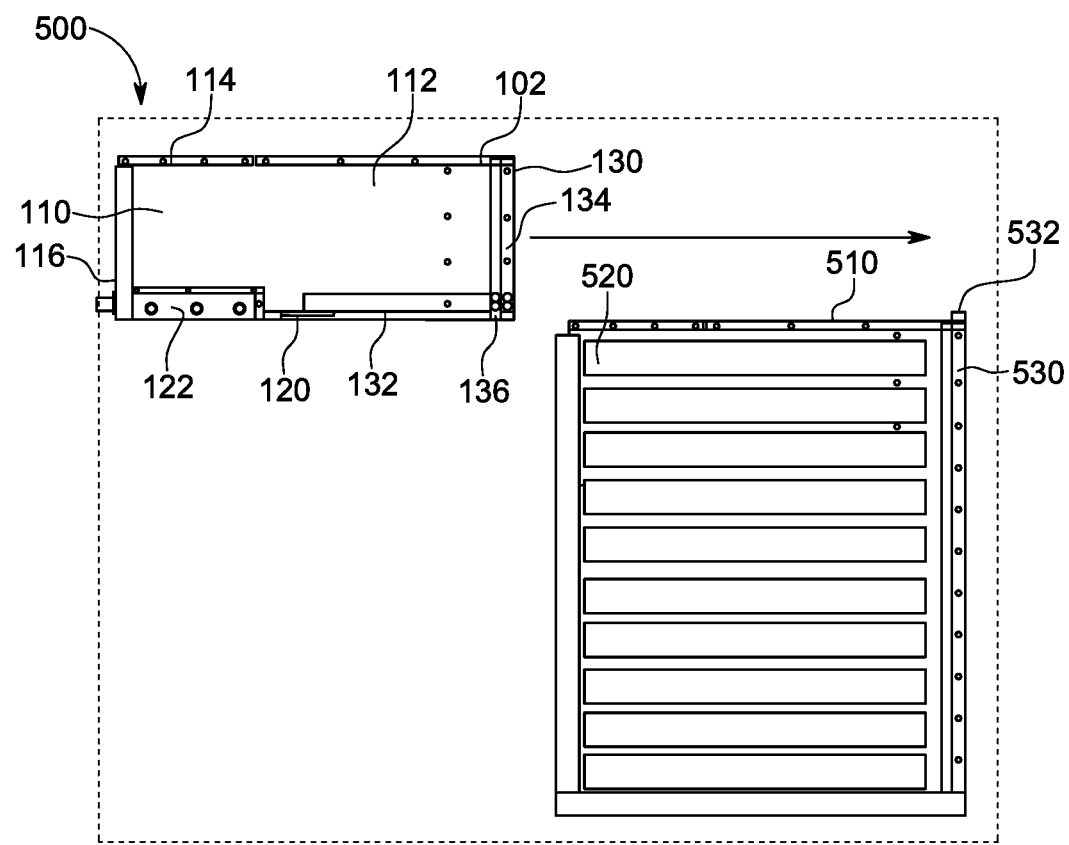
FIG. 5 is an exploded view of the chassis structure in FIGS. 1A-1B with a different sized box that holds more component sleds.

FIG. 5 shows a separate chassis assembly 500 that may incorporate a different sized lower box structures including the lower box structure 104 (in FIGS. 1A-1B and 2A-2C). In this example, the chassis assembly 500 includes the upper box structure 102 that is identical to the upper box structure 102 described above in reference to FIGS. 1A-1B and 2A-2C. Thus, like elements of the upper box structure 102 in FIG. 5 are labeled with identical numbers as their counterparts in FIGS. 1A-1B and 2A-2C.

The chassis assembly 500 includes a lower box structure 510 that may be mated with the upper box structure 102. The lower box structure 510 is spatially larger than the lower box structure 104 shown in FIG. 2A. Thus, additional component sleds 520 may be installed in the lower box structure 510. In this example, the lower box structure 510 has capacity for holding ten component sleds. Thus, in the case that greater than five component sleds (the capacity of the lower box structure 104 in FIG. 2A) are needed, the lower box structure 104 may be replaced with the lower box structure 510 in FIG. 5. The power supply does not have to be replaced with the addition of a new lower box structure such as the lower box structure 510, since the same upper box structure 102 may be used to provide power for either lower box structure 104 or 510.

The lower box structure 510 includes a vertical bus bar 530 that has a connection point 532. The connection point 532 may be connected to the connection point 136 of the bus bar structure 130 using a clip similar to the connection shown in FIGS. 3A-3B. Once the lower box structure 510 is mated with the upper box structure 102, power may be supplied from the bus bar structure 130 to the vertical bus bar 530 to power the component sleds 520 in the lower box structure 510.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including,"

"includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. An adaptable chassis comprising:
    a first chassis structure including a power supply, side walls to receive at least one component sled, and an engagement feature;
    a second chassis structure including side walls defining an open end to receive at least one component sled, the side walls each including an edge with protruding tabs, a top wall, a backstop member on the top wall opposite the open end, an engagement feature to engage the engagement feature of the first chassis structure, and a power connector to obtain power from the power supply, wherein the first chassis structure and the second chassis structure are slidably engaged with each other, the first chassis structure contacting the backstop member and the protruding tabs overlapping the side walls of the first chassis structure when the first chassis structure and the second chassis structure are slidably engaged with each other,
    wherein the first chassis structure includes a first bus structure at a rear end of the first chassis structure,
    wherein the first bus structure comprises a first bus bar structure and a first vertical bus bar extending over the height of the first chassis structure,
    wherein the first vertical bus bar includes a first connection point of the first chassis structure engaging with a connection structure of the second chassis structure.

2. The adaptable chassis of claim 1, wherein the second chassis structure includes a second vertical bus that is attachable to the first bus structure of the first chassis structure.

3. The adaptable chassis of claim 2, further comprising a connecting member to connect the second vertical bus of the second chassis structure to the first vertical bus bar of the first chassis structure.

4. The adaptable chassis of claim 1, wherein the first chassis structure includes a first power distribution board.

5. The adaptable chassis of claim 4, wherein the first bus structure includes a first horizontal support parallel to the side walls, the horizontal support having one end attached to the first power distribution board, and the first vertical bus bar attached to the opposite end of the first horizontal support.

6. The adaptable chassis of claim 1, wherein the second chassis structure may hold a first predetermined number of component sleds.

7. The adaptable chassis of claim 6, further comprising a third chassis structure including side walls to receive a second predetermined number of component sleds, the second predetermined number of component sleds different from the first predetermined number of component sleds, wherein the third chassis structure includes a registration feature to engage the registration feature of the first chassis structure, and a power connector to obtain power from the power supply, wherein the third chassis structure may be swapped for the second chassis structure.

* * * * *